United States Patent [19]

Hochreuther et al.

[11] Patent Number: 4,476,721
[45] Date of Patent: Oct. 16, 1984

[54] MULTI-PURPOSE MEASURING DEVICE WITH A HINGED DISPLAY

[75] Inventors: Karl Hochreuther, Nuremberg, Fed. Rep. of Germany; Jörg Tragatschnig, Zell am See, Austria

[73] Assignee: Metrawatt GmbH, Nuremberg, Fed. Rep. of Germany

[21] Appl. No.: 522,053

[22] Filed: Aug. 10, 1983

[30] Foreign Application Priority Data

Aug. 10, 1982 [DE] Fed. Rep. of Germany ....... 3229688

[51] Int. Cl.³ ...................... G01D 11/24; G01D 11/30
[52] U.S. Cl. ....................................... 73/431; 324/156
[58] Field of Search ....................... 73/431, 432 R, 23; 324/156; 224/205, 257

[56] References Cited

U.S. PATENT DOCUMENTS 1,807,439  5/1931  Ryan ............................... 324/156 X
3,026,072  3/1962  Hughes ................................. 73/431
3,608,362  9/1971  Chakar et al. ......................... 73/629

Primary Examiner—James J. Gill
Attorney, Agent, or Firm—Herbert L. Lerner; Laurence A. Greenberg

[57] ABSTRACT

Multi-purpose measuring device with a tilting display which includes a display assembly with a housing for visually indicating a measured value of a variable to be analyzed, an auxiliary assembly with another housing separate from the display assembly housing for performing measurements, a hinge interconnecting the housings permitting relative tilting of the housings in two directions into different planes at an angle relative to each other and into a common plane, and a carrying strap fastened in vicinity of the hinge, the auxiliary assembly having dimensions and weight in proportion to the display assembly causing the center of gravity of the measuring device to lie in vicinity of the auxiliary assembly and causing the auxiliary assembly to hang downward from the carrying strap with the display assembly disposed above the auxiliary assembly.

22 Claims, 3 Drawing Figures

MULTI-PURPOSE MEASURING DEVICE WITH A HINGED DISPLAY

The invention relates to a multi-purpose measuring device with a tilting display, including a display assembly with a housing for visually indicating a measured value of a variable to be analyzed, an auxiliary assembly with another housing separate from said display assembly housing for performing measurements and a hinge interconnecting said housings permitting relative tilting of said housings into different planes at an angle relative to each other and into a common plane.

Multi-purpose measuring devices should be sturdily constructed, simple to operate and easy to read. They should also be constructed with consideration given to their electrical safety. Since multi-purpose measuring devices are not only used at a work station, but are also used for assembly or testing purposes at other locations, it is desirable for the instruments to be adaptable to suit the respective working conditions.

Accordingly, in a practical construction, two housing parts are interconnected by a hinge, so that the device can be folded after the job is finished and can be carried in the operator's pocket. Such a device is known from German Published Non-Prosecuted Application (DE-OS No. 26 36 079). Additional advantages are obtained by using another conventional multi-purpose measuring device which is not only foldable but can also be carried around the neck with the aid of a carrying strap. The latter device is disclosed to German Published Non-Prosecuted Application DE-OS No. 28 36 679. The device described therein can be used on the work bench, as well as in the hanging condition, in which it can be tilted into a position that is advantageous for the user. The belt strap makes it possible to carry the multi-purpose measuring device without using the hands and to leave the hands free for performing the measuring operation when using the instrument in certain locations.

However, the prior art multi-purpose measuring devices have the disadvantage of having the display assembly disposed below the auxiliary assembly, when the multi-purpose measuring device is hung around the neck by means of a carrying strap. A considerable distance exists between the eyes of the observer and the display plane, so that difficulties arise when reading the device, especially if the housing is longer than it is wide.

A further disadvantage of these conventional multi-purpose measuring devices, is that their operating controls, especially the measuring range switch, are disposed on the surface of the vertically hanging auxiliary assembly unit. It is therefore only possible to see the operating elements and the chosen setting by lifting and tilting the instrument. This disadvantage is especially detrimental, if the multi-purpose measuring device is carried around the neck for testing at certain locations and is rarely used as a table instrument.

It is accordingly an object of the invention to provide a multi-purpose measuring device with a hinged display which overcomes the hereinafore-mentioned disadvantages of the heretofore-known devices of this general type.

With the foregoing and other objects in view, there is provided in accordance with the invention, a multi-purpose measuring device with a tilting display, which includes a display assembly with a housing for visually indicating a measured value of a variable to be analyzed, an auxiliary assembly with another housing separate from the display assembly housing for performing measurements, a hinge interconnecting the housings permitting relative tilting of the housing in two directions into different planes at an angle relative to each other and into a common plane, and a carrying strap fastened in vicinity of the hinge, the auxiliary assembly having dimensions and weight in proportion to the display assembly causing the center of gravity of the measuring device to lie in vicinity, the auxiliary assembly and causing the auxiliary assembly to hang downward from the carrying strap with the display assembly disposed above the auxiliary assembly.

Further in accordance with the objects of the invention, there is provided a multi-purpose measuring device with a tilting display, including a display assembly with a housing for visually indicating a measured value of a variable to be analyzed, an auxiliary assembly with another housing separate from the display assembly housing for performing measurements, a hinge interconnecting the housings permitting relative tilting of the housings into different planes at an angle relative to each other and into a common plane, a measured value display disposed in a given plane in the display assembly housing, a measuring range switch built into the display assembly housing, the measuring range switch including an operating button having a measuring range indicator disposed in the given plane, and the operating button being disposed in a recess formed in the display assembly housing, being rotatable in a plane perpendicular to the given plane and being manually accessible from at least two sides of the display assembly housing.

In accordance with another feature of the invention, the operating button is curved, the display assembly housing has two outer corners and outer edges following the curvature of the operating button, and the recess is disposed in one of the outer corners.

In accordance with a further feature of the invention, there are provided indicators for operating functions of the measuring device being disposed in the given plane.

In accordance with an additional feature there are provided bellows formed of rubbery elastic material interconnecting the housings and forming a water-tight cover for the hinge.

In accordance with an added feature of the invention there are provided measuring lines connected to the carrying strap substantially at shoulder height, the measuring lines being electrically connected to the auxiliary assembly in vicinity of the fastening of the carrying strap, and measuring probes or points connected to ends of the measuring lines.

In accordance with yet another feature of the invention, the measuring lines are in the form of extensible spirally-coiled cables between the measuring probes and the carrying strap.

In accordance with yet a further feature of the invention, there are provided means for holding the measuring probes when not in use.

In accordance with yet an additional feature of the invention, there is provided a device for separating and reconnecting the carrying strap in the middle thereof.

In accordance with yet an additional feature of the invention, the measuring probes have gripping portions having openings formed therein for securing the measuring probes to two sides of the auxiliary assembly housing.

In accordance with yet an added feature of the invention, the auxiliary assembly has a side facing away from the display assembly, and including a connector unit attached to the side of the auxiliary assembly.

Since the display assembly and the auxiliary assembly can both be tilted in different position to lie in a common plane, the multi-purpose measuring device can be much better adjusted to suit the respective working conditions. If the device is to be used on the work bench, the display assembly can be tilted to a position in which the display can be seen above the auxiliary assembly. In this case, the auxiliary assembly is not in the way, because the head may be brought as close to the display as desired. If the device is carried by hanging around the neck, the display assembly is tilted to the other side, so that the display assembly can be seen first i.e. so that the auxiliary assembly lies below the display until. The other features of the invention serve the purpose of holding the measuring device in a stable hanging position, so that the display remains in view, even if the device is not supported against the body of the user.

Another possibility for considerably improving the multi-purpose measuring device compared to the present state of the art, results from integrating the measuring range switch into the display assembly. This feature permits the operation of the device to be greatly simplified, because the display and the measuring range switch are disposed in the same viewing direction. It is also essential for the measuring range switch to occupy as little space as possible within the display assembly, and for it to be easily operated. For this reason, the operating button of the measuring range switch is fitted into a recess in the housing in such a manner that its rotation plane lies at a right angle to the plane of the display, and that the operating button is accessible from at least two sides of the housing.

The operating button of the measuring range switch is especially easily accessible if it is fitted into one of the two outer corners of the display unit. The operation is further facilitated, if the shape of the housing is adapted to the curvature of the operating button in vicinity of the outer edges of the housing, since in this case the corners and edges of the housing do not hinder the operation of the instrument. It is practical if the other operating controls of the multi-purpose measuring device, beside the measuring range switch, are also disposed in the same plane as the display for the measured value.

The electrical safety of the device is enhanced if the housings of the display assembly and the auxiliary assembly are connected to each other by a bellows made of a rubber-like elastic material, which covers the hinge in a water-tight manner.

A considerable improvement in the ease of operating the instrument is achieved by placing the measuring lines in a region partly within the carrying strap, with the measuring lines electrically connected with the measuring device. These measuring lines emerge from the carrying strap approximately at shoulder height, and are constructed as extensible spirally wound cables, up to the measuring probes. An uncontrolled swinging of the measuring probes when not used is avoided by providing additional holding places for storing the measuring probes at the measuring device. On one hand, this avoids danger caused by the measuring lines and, on the other hand, the measuring probes are always ready to be used. The carrying strap is constructed in such a way that it can be parted in the middle by means of a connection device, so that the strap is not in the way if the multi-purpose measuring device is used on a work table.

In order to better secure the measuring probes at the measuring instrument or at the carrying strap, the measuring probes may be provided with holding openings, into which holding pins can be engaged. The pins may be constructed according to the principle of press fasteners or push buttons. Therefore, if the working place is far away, the measuring probes are reliably stored i.e. swinging of the measuring lines is avoided.

A connector element can be provided at the side of the device which faces away from the display assembly. This connector may be used to accommodate additional components, such as a battery or a connection to the power supply. The added weight and the position of the connector add to the stability of the position of the instrument if the multi-purpose measuring device is used in the hanging position.

Other features which are considered as characteristic for the invention are set forth in the appended claims.

Although the invention is illustrated and described herein as embodied in multi-purpose measuring device with a hinged display, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings in which.

Figure 1:
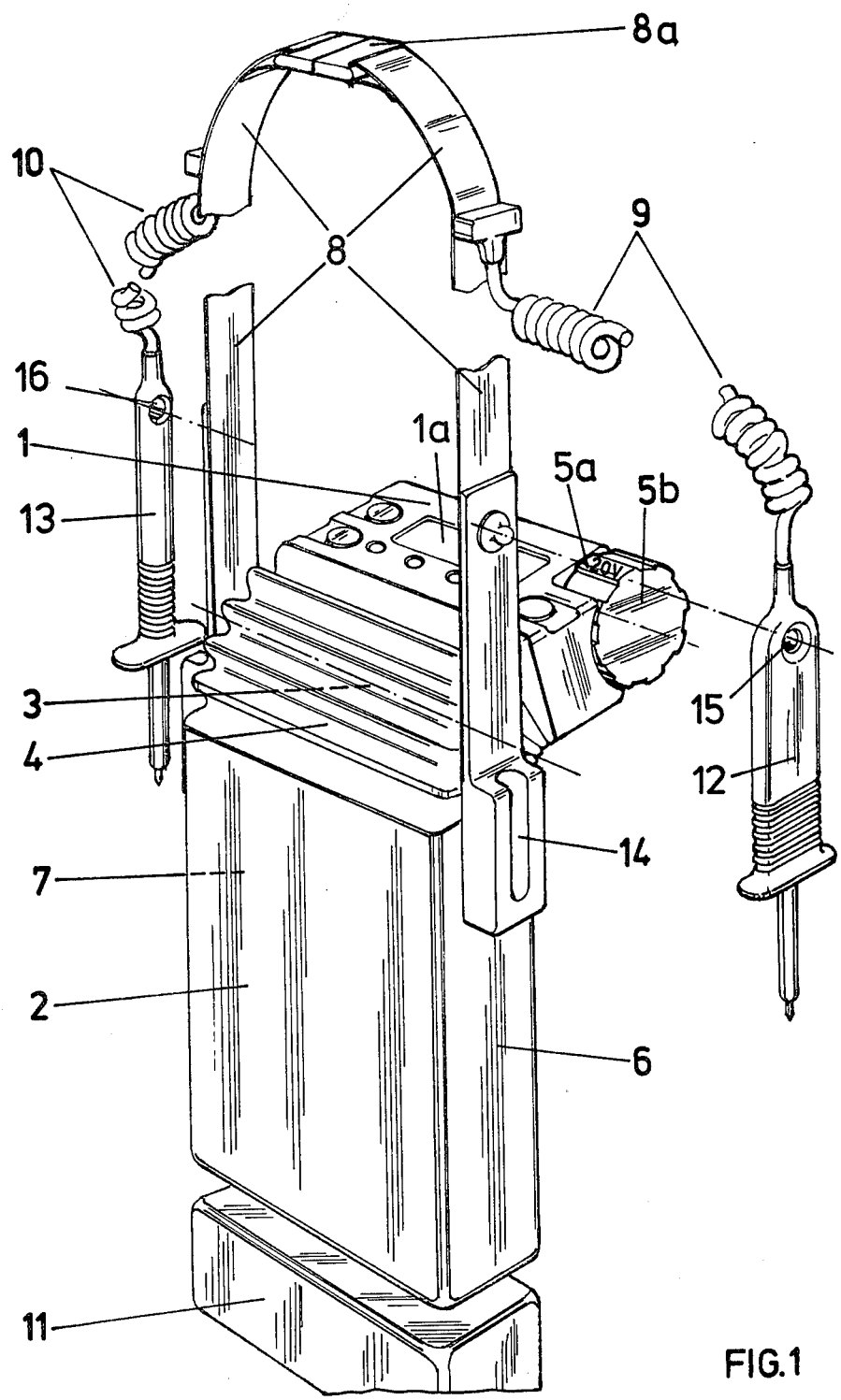
FIG. 1 is a fragementary, diagrammatic, perspective view of a multi-purpose measuring device, hanging on a carrying strap, with the display module tilted to one side.

Referring now to the figures of the drawing in detail and first, particularly, to FIG. 1 thereof, there is seen a multi-purpose measuring device in the position which it occupies when it is carried around the neck. A display module 1 is shown which is tilted to one side with respect to an auxiliary assembly 2 having a long side 6 in such a manner that the display is oriented upward and the center of gravity 7 of the measuring device is in the auxiliary assembly 2. A hinge 3 which interconnects the two sub-assemblies 1, 2 is not visible in the drawing, because it is covered by bellows 4, and therefore the location of the hinge 3 is shown with a broken lead line. The bellows permits the unrestricted tilting motion of the sub-assemblies and also provides good protection against dust and spraying water for the housings.

A carrying strap 8 is fastened at both sides of the sub-assembly 2 in vicinity of the hinge 3. Two measuring lines with probes are electrically connected to the auxiliary sub-assembly in vicinity of the attachment points of the carrying strap 8, and the probes may be embedded in a partial portion of the carrying strap. These measuring probes emerge from the carrying strap 8 at shoulder height where the lines are in the form of extensible, spirally coiled cables 9, 10 with the measuring probes or points 12, 13 fastened at respective ends thereof.

Holding means 14 are provided on the carrying strap on the auxiliary sub-assembly 2, into which the measuring probes 12, 13 can be inserted. The measuring probes may be additionally secured by means of holding pins 17 and openings 15, 16 formed in the probes. Thus, the measuring probes 12, 13 are safely stored when they are not in use, and do not protrude in an uncontrolled way. On the other hand, the probes are always handy and can be easily moved to the measuring point by the extensible spirally-coiled cables 9, 10.

All of the operating controls, especially range switches 5, are disposed in the display module 1. This accomplishes the objective of having all of the display elements lie in one plane where they consequently can be seen from one viewing direction. As operating button 5b of the measuring range switch 5 is disposed in the outermost right corner of the display module, so that it is easily accessible for the right hand. A display 5a for the measuring range is effected directly by the operating button 5b, and is tilted by its rotation into the same plane as a display 1a for a measured value.

Figure 2:
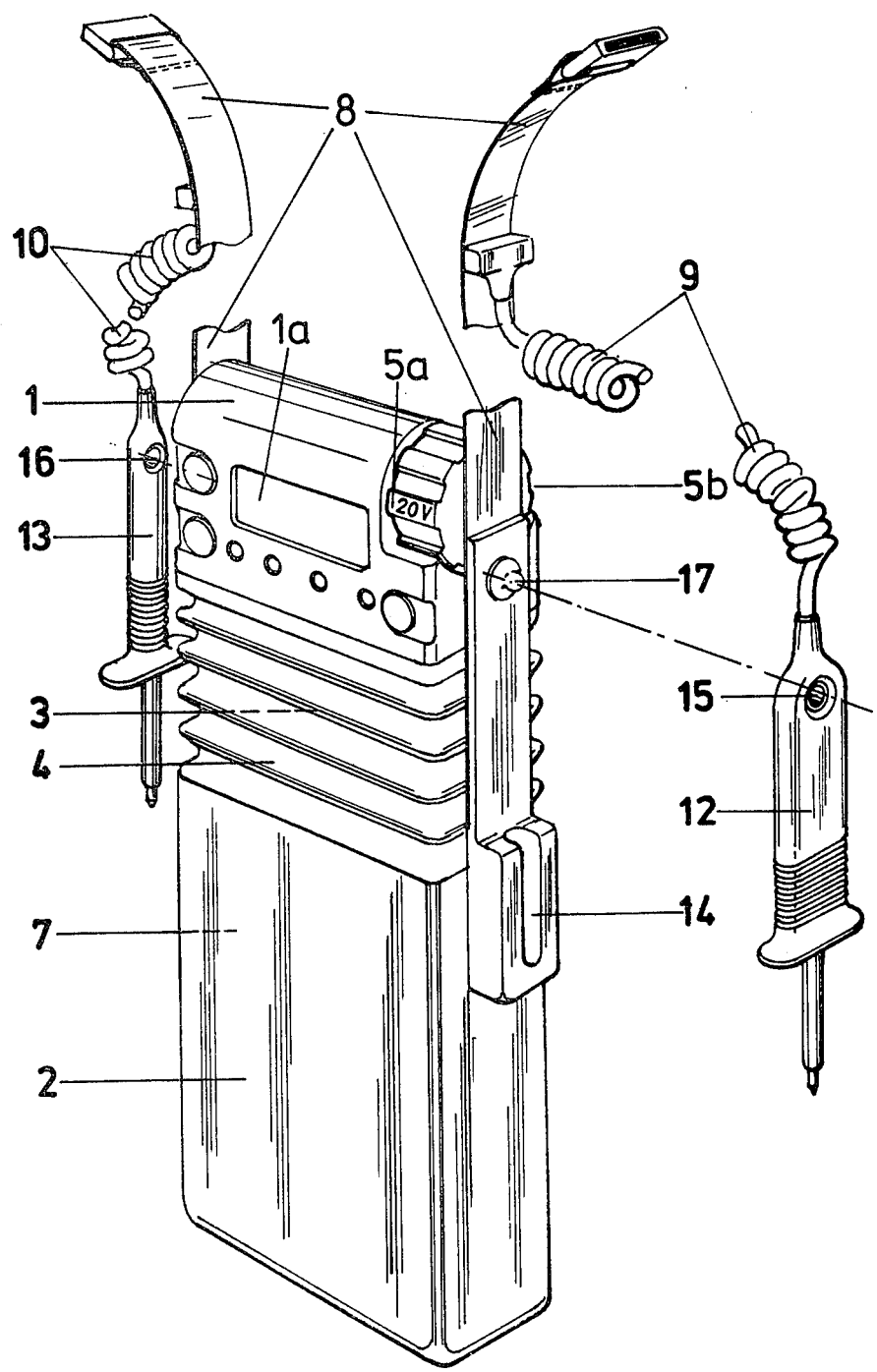
FIG. 2 is a view similar to FIG. 1 of a multi-purpose measuring device with a divided carrying strap, wherein the display module and the auxiliary assembly lie in the same plane.

In FIG. 2, the display module 1 is tilted up into the same plane as the auxiliary sub-assembly 2. Therefore, it is in an intermediate position between the two operating positions shown in FIG. 1 and FIG. 3.

Figure 3:
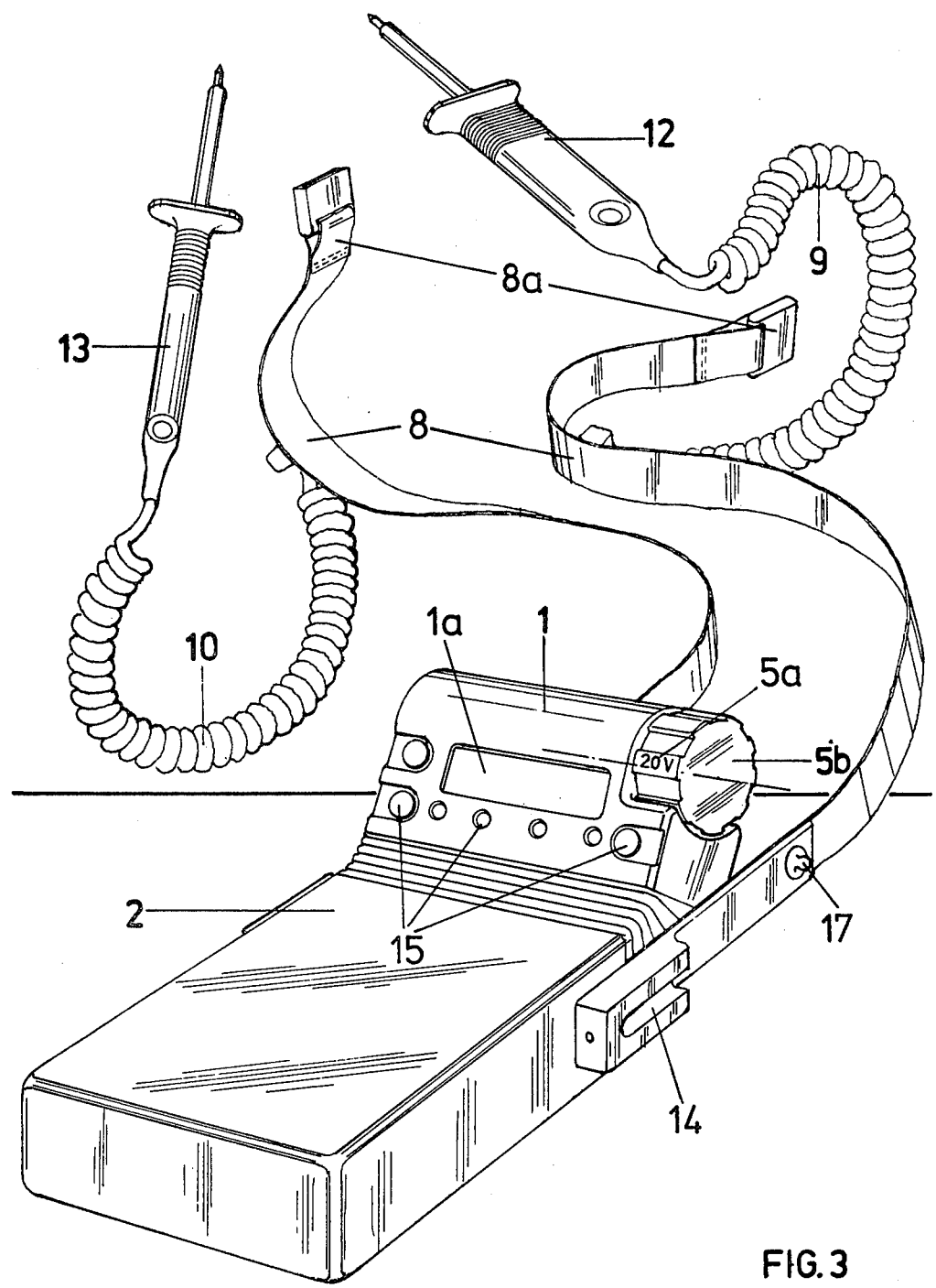
FIG. 3 is a perspective view of a multi-purpose measuring device positioned on a table, with the display module tilted to the other side relative to FIG. 1 and the carrying strap parted in the middle.

FIG. 3 shows the multi-purpose measuring device in the second operating position, disposed on a table. In this case, the display module 1 is tilted to the other side of the auxiliary subassembly 2, with respect to the view of FIG. 1. The angle which the two sub-assemblies 1, 2 form with each other can be adjusted according to the position in which the user is sitting, and can be set in any desired manner. In order to utilize the full radius of action or movement of the measuring probes 12, 13 on the spiral cables 9, 10, the carrying strap 8 can be parted in the middle. For this purpose, a connection device 8a is provided, which can be opened and closed again.

As shown in FIG. 1, the auxiliary sub-assembly may be provided with a connector element 11, which serves for attaching an additional auxiliary power supply, for example.

The foregoing is a description corresponding, in substance, to German application No. P 32 29 688.6, dated Aug. 10, 1982, international priority of which is being claimed for the instant application, and which is hereby made part of this application. Any material discrepancies between the foregoing specification and the specification of the aforementioned corresponding German application are to be resolved in favor of the latter.

We claim:

1. Multi-purpose measuring device with a tilting display, comprising a display assembly with a housing for visually indicating a measured value of a variable to be analyzed, an auxiliary assembly with another housing separate from said display assembly housing for performing measurements, a hinge interconnecting said housings permitting relative tilting of said housing in two directions into different places at an angle relative to each other and into a common plane, and a carrying strap fastened in vicinity of said hinge, said auxiliary assembly having dimensions and weight in proportion to said display assembly causing the center of gravity of the measuring device to lie in vicinity of said auxiliary assembly and causing said auxiliary assembly to hang downward from said carrying strap with said display assembly disposed above said auxiliary assembly.

2. Multi-purpose measuring device according to claim 1, wherein said display assembly housing includes a measured value display in a given plane, a measuring range switch built into said display housing, and a measuring range indicator of said measuring range switch in said given plane.

3. Multi-purpose measuring device according to claim 2, wherein said measuring range switch includes an operating button disposed in a recess formed in said display assembly housing and being manually accessible from at least two sides of said display assembly housing, said operating button being rotatable in a plane perpendicular to said given plane.

4. Multi-purpose measuring device with a tilting display, comprising a display assembly with a housing for visually indicating a measured value of a variable to be analyzed, an auxiliary assembly with another housing separate from said display assembly housing for performing measurements, a hinge interconnecting said housings permitting relative tilting of said housings into different planes at an angle relative to each other and into a common plane, a measured value display disposed in a given plane in said display assembly housing, a measuring range switch built into said display assembly housing, a measuring range switch including an operating button having a measuring range indicator disposed in said given plane, and said operating button being disposed in a recess formed in said display assembly housing, being rotatable in a plane perpendicular to said given plane and being manually accessible from at least two sides of said display assembly housing.

5. Multi-purpose measuring device according to claim 3, wherein said operating button is curved, said display assembly housing has two outer corners and outer edges following the curvature of said operating button, and said recess is disposed in one of said outer corners.

6. Multi-purpose measuring device according to claim 4, wherein said operating button is curved, said display assembly housing has two outer corners and outer edges following the curvature of said operating button, and said recess is disposed in one of said outer corners.

7. Multi-purpose measuring device according to claim 2, including indicators for operating functions of the measuring device, being disposed in said given plane.

8. Multi-purpose measuring device according to claim 4, including indicators for operating functions of the measuring device being disposed in said given plane.

9. Multi-purpose measuring device according to claim 1, including bellows formed of rubbery elastic material interconnecting said housings and forming a water-tight cover for said hinge.

10. Multi-purpose measuring device according to claim 4, including bellows formed of rubbery elastic material interconnecting said housings and forming a water-tight cover for said hinge.

11. Multi-purpose measuring device according to claim 1, including measuring lines connected to said carrying strap substantially at shoulder height, said measuring lines being electrically connected to said auxiliary assembly in vicinity of the fastening of said carrying strap, and measuring probes connected to ends of said measuring lines.

12. Multi-purpose measuring device according to claim 4, including measuring lines connected to said carrying strap substantially at shoulder height, said measuring lins being electrically connected to said auxiliary assembly in vicinity of the fastening of said carrying strap, and measuring probes connected to ends of said measuring lines.

13. Multi-purpose measuring device according to claim 11, wherein said measuring lines are in the form of extensible spirally-coiled cables between said measuring probes and said carrying strap.

14. Multi-purpose measuring device according to claim 12, wherein said measuring lines are in the form of extensible spirally-coiled cables between said measuring probes and said carrying strap.

15. Multi-purpose measuring device according to claim 11, including means for holding said measuring probes when not in use.

16. Multi-purpose measuring device according to claim 12, including means for holding said measuring probes when not in use.

17. Multi-purpose measuring device according to claim 1, including a device for separating and reconnecting said carrying strap in the middle thereof.

18. Multi-purpose measuring device according to claim 4, including a device for separating and reconnecting said carrying strap in the middle thereof.

19. Multi-purpose measuring device according to claim 11, wherein said measuring probes have gripping portions having openings formed therein for securing said measuring probes to two sides of said auxiliary assembly housing.

20. Multi-purpose measuring device according to claim 12, wherein said measuring probes have gripping portions having openings formed therein for securing said measuring probes to two sides of said auxiliary assembly housing.

21. Multi-purpose measuring device according to claim 1, wherein said auxiliary assembly has a side facing away from said display assembly, and including a connector unit attached to said side of said auxiliary assembly.

22. Multi-purpose measuring device according to claim 4, wherein said auxiliary assembly has a side facing away from said display assembly, and including a connector unit attached to said side of said auxiliary assembly.

* * * * *